(12) United States Patent
Lee

(10) Patent No.: US 7,161,374 B2
(45) Date of Patent: Jan. 9, 2007

(54) TEST PATTERN OF SEMICONDUCTOR DEVICE AND TEST METHOD USING THE SAME

(75) Inventor: Jong-Hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/028,784

(22) Filed: Jan. 4, 2005

(65) Prior Publication Data
US 2005/0156617 A1 Jul. 21, 2005

(30) Foreign Application Priority Data
Jan. 20, 2004 (KR) .................. 10-2004-0004378

(51) Int. Cl.
*G01R 31/26* (2006.01)
(52) U.S. Cl. .................................. 324/769
(58) Field of Classification Search ............ 324/158.1, 324/765, 525, 537, 760, 527, 528, 531; 257/48, 257/40
See application file for complete search history.

(56) References Cited

U.S. PATENT DOCUMENTS

| | | | | |
|---|---|---|---|---|
| 5,485,095 A | * | 1/1996 | Bertsch et al. | .............. 324/537 |
| 5,561,367 A | * | 10/1996 | Goettling et al. | ........ 324/158.1 |
| 5,834,795 A | | 11/1998 | Lee | .............................. 257/48 |
| 5,877,631 A | | 3/1999 | Takahashi | .................... 324/533 |
| 6,509,739 B1 | * | 1/2003 | Voogel et al. | .............. 324/525 |
| 6,960,785 B1 | * | 11/2005 | Jin et al. | ...................... 257/57 |
| 2003/0102474 A1 | | 6/2003 | Wang | ......................... 257/48 |

FOREIGN PATENT DOCUMENTS

KR 02-56291 7/2002

* cited by examiner

*Primary Examiner*—Jermele Hollington
*Assistant Examiner*—Tung X. Nguyen
(74) *Attorney, Agent, or Firm*—Mills & Onello LLP

(57) ABSTRACT

There are provided a test pattern of a semiconductor device and a test method using the same. The test pattern of the semiconductor device includes a conductive pattern disposed on a semiconductor substrate, and the conductive pattern includes a plurality of line regions, which are aligned in parallel, and spaced at a uniform interval, and a plurality of connecting regions for connecting the plurality of line regions in a zigzag shape. The test pattern includes a plurality of transistors electrically switching first ends of the adjacent line regions corresponding to the connecting region, and each transistor includes a source region, which is electrically connected to one end of one of the adjacent line regions, and a drain region, which is electrically connected to one end of the other one of the adjacent line regions. Further, a transistor selecting part is electrically connected to gates of the plurality of transistors, for selecting one of the plurality of transistors or a combination thereof.

5 Claims, 4 Drawing Sheets

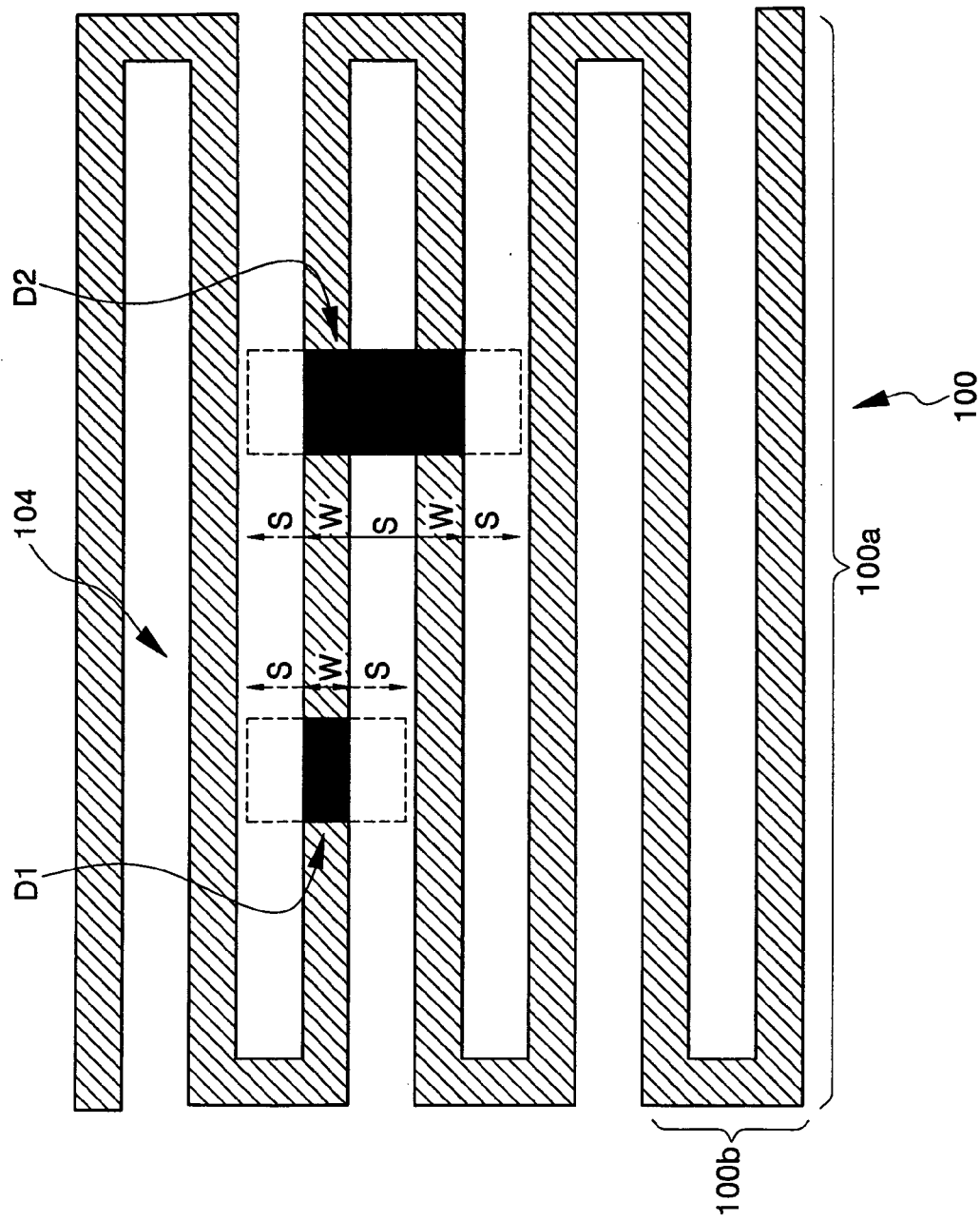

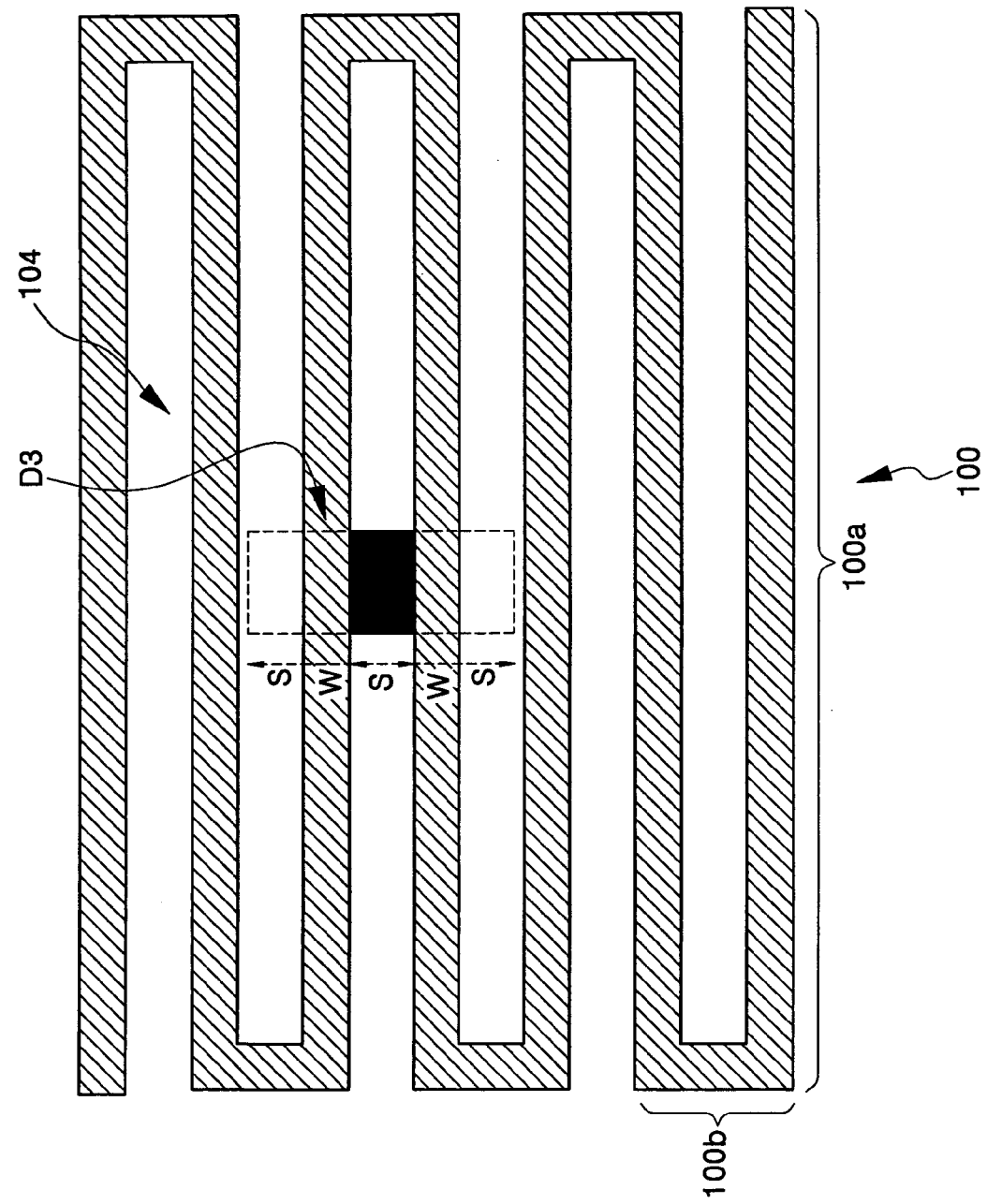

TEST PATTERN OF SEMICONDUCTOR DEVICE AND TEST METHOD USING THE SAME

CROSS-REFERENCE TO RELATED APPLICATION

This application claims the benefit of Korean Patent Application No. 2004-0004378, filed Jan. 20, 2004, the contents of which are hereby incorporated herein by reference in their entirety.

BACKGROUND

1. Technical Field

The present invention relates to a test pattern of a semiconductor device and a test method using the same, and more particularly, to a test pattern for testing a conductive pattern of a semiconductor device to examine its electric failures, and a test method using the same.

2. Discussion of the Related Art

In order to operate a semiconductor device at required performance requirements, required conditions for alignment, isolation, and electrical connection between its component elements should be satisfied. Further, reduction of a design rule, and formation of a multilayer interconnection structure are required for high integration of a semiconductor device, and thus, the alignment, the isolation, and the electrical connection between its component elements are important factors which directly affect production yield of the semiconductor device. Therefore, the fabrication of a semiconductor device includes various kinds of testing operations in order to determine whether each component element is structured as it is designed before performing each process of the fabrication of a semiconductor device, and to check whether it operates as it should.

When a conductive pattern is formed on a semiconductor substrate, various tests are performed to evaluate the characteristics of the conductive pattern. One of the tests is to examine whether the conductive pattern experiences electrical failures. For example, in the case of forming a polysilicon pattern for forming a gate electrode on a semiconductor substrate, the polysilicon pattern is formed by forming a polysilicon layer on the semiconductor substrate through a chemical vapor deposition (CVD) method, and then performing photolithography and etch processes. However, the polysilicon layer may have electrical defects, for example, short or open conditions due to defects such as particles.

Conventionally, an in-line scanning electron microscope has been used to examine the electrical failures in the conductive pattern such as the polysilicon pattern, or the like. However, examination by the in-line scanning electron microscope has limitations in resolution and accuracy. Further, it takes long to do the test because of a commonly used scanning method, and it is difficult to discriminate important defect types, which may directly effect a reduction in production yield. Therefore, it is required to fabricate a test pattern capable of providing various information for an electrical failure caused in the conductive pattern in a short time. In this connection, a structure of a semiconductor device for detecting a gate defect by an electrical method, and a method of detecting gate defects using the same is disclosed in US Patent Application Publication No. 2003-0102474. Further, a test structure of a semiconductor device for detecting whether a conductive pattern is short or open and locating the position where the short or open is generated, and an evaluation method using the same is disclosed in U.S. Pat. No. 5,877,631.

SUMMARY OF THE INVENTION

Therefore, the present invention provides a test pattern for providing various information related to an electrical failure of a conductive pattern.

The present invention also provides a method of testing a semiconductor device using the test pattern.

According to one aspect of the present invention, there is provided a test pattern of a semiconductor device. The test pattern of the semiconductor device includes a conductive pattern disposed on a semiconductor substrate. Further, the test pattern includes a plurality of transistors, which define the conductive pattern by a predetermined interval, and the source and drain regions of which are electrically connected to different positions of the conductive pattern. Further, the test pattern includes a transistor selecting part, which is electrically connected to each gate of the plurality of transistors, and selects one of the plurality of transistors or a combination thereof.

In accordance with an exemplary embodiment, the conductive pattern may include a plurality of line regions, which are aligned in parallel and spaced at a uniform interval, and a plurality of connecting regions for connecting the plurality of line regions in a zigzag shape. Further, the plurality of transistor may electrically switch first ends of the adjacent line regions corresponding to the connecting region, and each transistor may include a source region, which is electrically connected to one end of one of the adjacent line regions, and a drain region, which is electrically connected to one end of the other one of the adjacent line regions.

In accordance with an exemplary embodiment, the transistor selecting part may include a plurality of selecting pads electrically connected to the gates of the plurality of transistors. Further, the transistor selecting part may include a decoder electrically connected to the gates of the plurality of transistors, and a decoder pad for transmitting an input signal to the decoder.

In accordance with another aspect of the present invention, there is provided a method of testing a semiconductor device. The method includes measuring a resistance of a conductive pattern disposed on a semiconductor substrate, and detecting whether an electrical failure exists in the conductive pattern, and, if an electrical failure exists, determining a type of the electrical failure. The method also includes repeating steps of selecting one of a plurality of transistors, which define the conductive pattern by a predetermined interval and have source and drain regions electrically connected to different positions of the conductive pattern respectively, or a combination thereof, and operating it, to locate the position where the electrical failure exists, and determining a size of the defect causing the electrical failure.

In one embodiment of the method, the conductive pattern includes a plurality of line regions, which are aligned in parallel, and spaced at a uniform interval, and a plurality of connecting regions for connecting the plurality of line regions in a zigzag shape. The plurality of transistors can electrically switch first ends of the adjacent line regions corresponding to the connecting region, and each transistor includes a source region, which is electrically connected to one end of one of the adjacent line regions, and a drain region, which is electrically connected to one end of the other one of the adjacent line regions. In one embodiment, the conductive pattern is a polysilicon pattern. In one embodiment, if a resistance of the conductive pattern is higher than a line resistance of the conductive pattern, then it is determined that the conductive pattern comprises an open circuit. The position where the open circuit exists can be detected by a unit of the line region, and the open circuit exists in one of the plurality of line regions, or at least two adjacent line regions among the plurality of line regions at the same time. In one embodiment, a size of the defect causing the open circuit is given by $nW+(n-1)S \leq Do \leq nW+(n+1)S$; wherein Do is size of a defect causing the open circuit, W is width of a line region, S is width of a space region, and n is the number of line regions having an open circuit.

In one embodiment, if a resistance of the conductive pattern is smaller than a specific line resistance of the conductive pattern, then it is determined that the conductive pattern comprises a short circuit. In one embodiment, a size of the defect causing the short circuit is given by $(n-2)W+(n-1)S \leq Ds \leq nW+(n+1)S$; wherein Cs is size of a defect causing the short circuit, W is width of a line region, S is width of a space region, and n is the number of line regions having a short circuit.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention. In the drawings, the thicknesses of layers and regions are exaggerated for clarity.

FIG. 3 is a schematic plan view illustrating a conductive pattern region of FIG. 2 to illustrate a method of evaluating a size of the defect causing an open circuit according to an embodiment of the present invention.

FIG. 4 is a schematic plan view illustrating a conductive pattern region of FIG. 2 to illustrate an evaluation method of a size of the defect causing a short circuit according to an embodiment of the present invention.

DETAILED DESCRIPTION OF THE INVENTION

Figure 1:
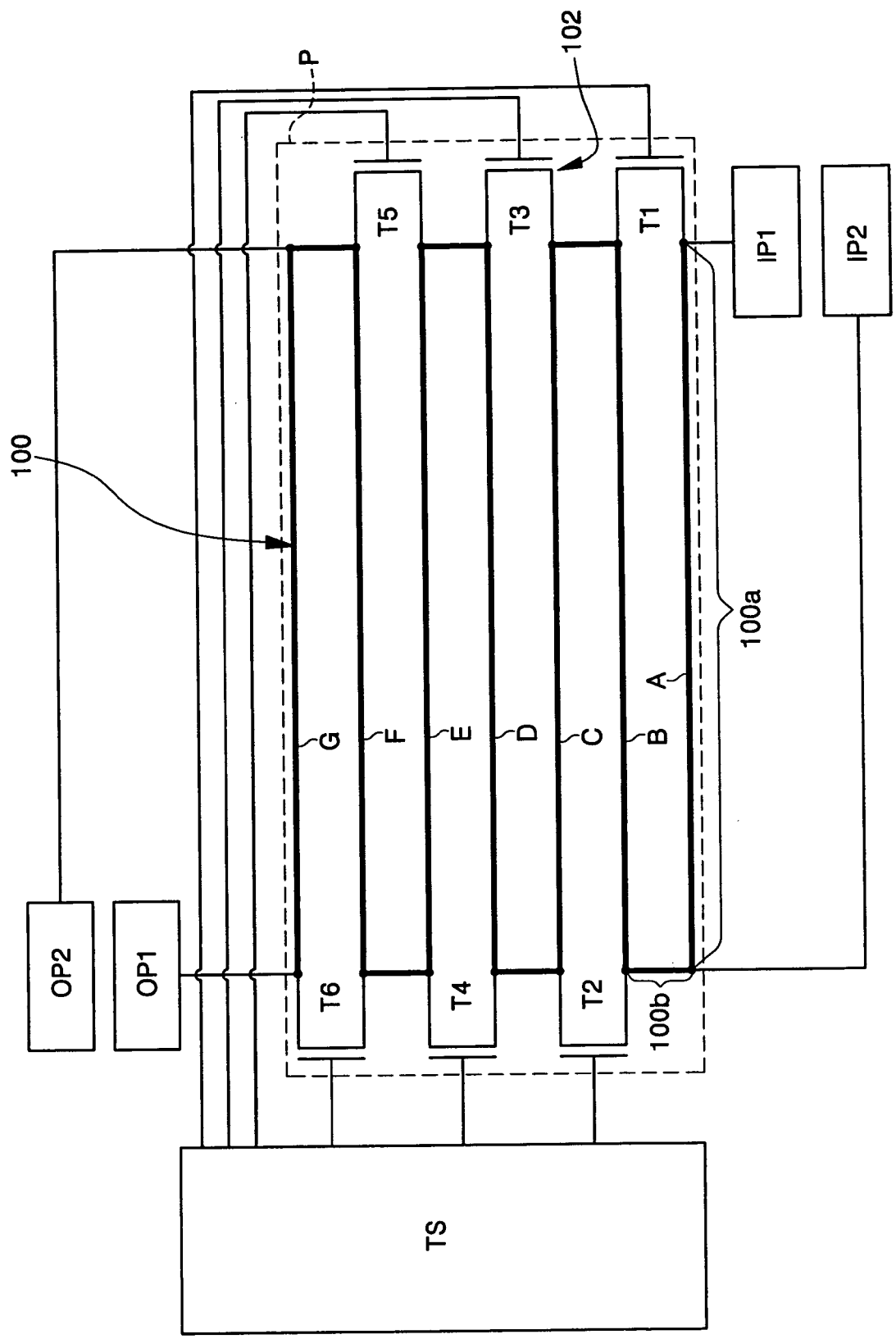
FIG. 1 is a circuit diagram illustrating a test pattern of a semiconductor device according to an embodiment of the present invention.

FIG. 1 is a circuit diagram illustrating a test pattern of a semiconductor device according to an embodiment of the present invention. The test pattern of the present invention is a test pattern for examining electrical failures of a gate pattern.

Referring to FIG. 1, a conductive pattern 100 is disposed on a semiconductor substrate. The conductive pattern 100 is preferably a polysilicon pattern. As shown in FIG. 1, the conductive pattern 100 includes a plurality of line regions 100a, which are aligned in a horizontal direction in parallel with each other, and spaced at a uniform interval, and a plurality of connecting regions 100b, each of which is disposed between two adjacent line regions 100a at their ends alternately in a direction perpendicular to the line regions 100, thereby connecting the plurality of line regions 100a continuously. Hereinafter, this shape will be referred to as a "zigzag shape" for the convenience of description throughout the specification. The ends of the conductive pattern 100 are connected to an input pad IP1 and an output pad OP1. According to an embodiment of the present invention, the conductive pattern 100 may further include an additive input pad IP2, which is electrically connected to the connecting region 100b, which is first connected to the input pad IP1 along the conductive pattern 100, and an additive output pad OP2, which is electrically connected to the connecting region 100b, which is first connected to the output pad OP1 along the conductive pattern 100. A voltage is applied between the input pad IP1 and the output pad OP1 to measure a resistance of the conductive pattern 100. Functions of the additive input pad IP2 and the additive output pad OP2 will be described in detail below.

According to an embodiment of the present invention, a plurality of transistors 102 are connected to the conductive pattern 100 having a zigzag shape so that the conductive pattern 100 is defined into a plurality of regions by the plurality of transistors 102. In more detail, each of the plurality of transistors 102 is disposed at the position corresponding to each of the connecting regions 100b, and electrically switches first ends of the adjacent line regions 100a. That is, each source region of the plurality of transistors 102 is electrically connected to one end of one of the adjacent line regions 100a, and each drain region of the plurality of transistors 102 is electrically connected to one end of the other one of the adjacent line regions 100a.

Each gate of the plurality of transistors 102 is connected to a transistor selecting part TS. The transistor selecting part TS selects one of the plurality of transistors 102, or a combination thereof, and turns on the selected one or more transistors. The transistor selecting part TS may include a plurality of selecting pads, each of which is electrically connected to each gate of the plurality of transistors 102. In this case, the number of the selecting pads of the transistor selecting part TS is equal to that of the plurality of transistors 102. Preferably, the transistor selecting part TS may further include a decoder electrically connected to each gate of the plurality of transistors 102, and a decoder pad for transmitting an input signal to the decoder.

Figure 2:
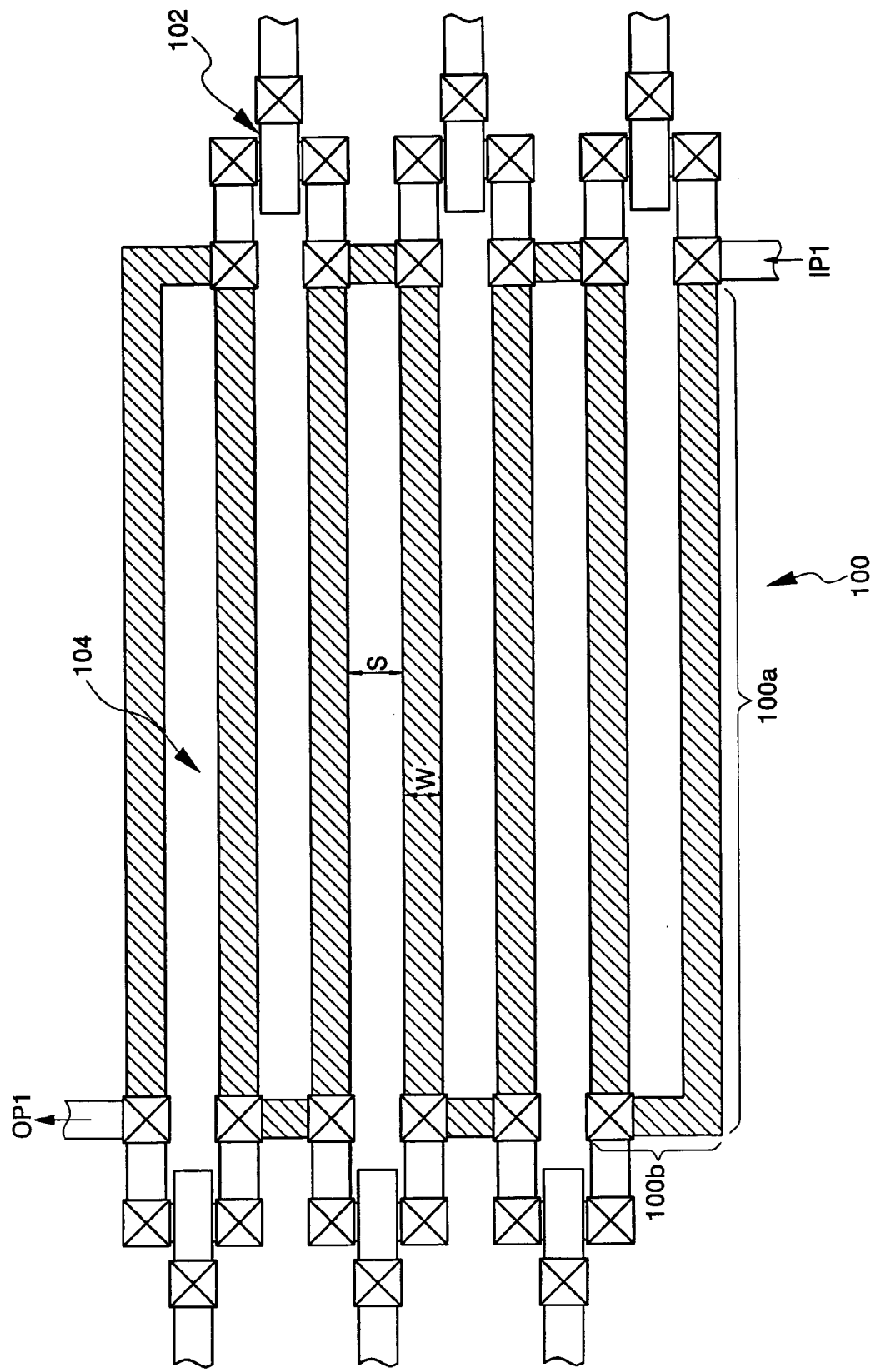
FIG. 2 is a layout illustrating a portion P of FIG. 1.

FIG. 2 is a layout of a portion P of FIG. 1, shown in dashed lines, to illustrate the conductive pattern 100 and the plurality of transistors 102 in more detail.

Referring to FIG. 2, the conductive pattern 100 has a zigzag shape as described above. The conductive pattern 100 may be disposed on the semiconductor substrate, and an insulating layer such as a silicon oxide layer is preferably formed on the entire surface of the semiconductor substrate before the conductive pattern 100 is disposed. The conductive pattern 100 is preferably a polysilicon pattern as described above, and includes a plurality of line regions 100a which are aligned in parallel and spaced at a uniform interval, and a plurality of connecting regions 100b, each of which connects two adjacent line regions 100a alternately, thereby connecting the plurality of line regions 100a continuously. The conductive pattern 100 may have a zigzag shape as described above. The plurality of line regions 100a of the conductive pattern 100 preferably have a same width W, and space regions 104 defined by the plurality of line regions 100a also have a same width S. Each source region and each drain region of the plurality of transistors 102 are electrically connected to respective first ends of the adjacent line regions 100a.

The connection of each source region and each drain region of the plurality of transistors 102 to the first ends of the line regions 100a can be modified in various forms by those skilled in the art.

Referring to FIG. 1, a test method of a semiconductor device according to an embodiment of the present invention will be described.

An electrical failure in the embodiment of the present invention refers to a short circuit or an open circuit. Further, it is assumed that the short circuit and open circuit are generated in only one region of the conductive pattern to be tested in the embodiment of the present invention.

First, a method of detecting whether an electrical failure exists in the conductive pattern 100 or not, and the kinds of the electrical failure is as follows. Normally, a resistance of a conductive line can be given by a following formula.

$$R = \rho(L/A) \qquad \text{<Formula 1>}$$

(R: line resistance, ρ: specific resistance, A: surface area of conductive line, L: length of conductive line)

According to an embodiment of the present invention as described above, the conductive pattern 100 is a polysilicon pattern. A resistance of a conductive line in the case of no electrical failures in the polysilicon pattern can be determined from the formula 1. Throughout the entire specification including claims hereinafter, a resistance of a conductive pattern without electrical failures will be referred to as a specific line resistance.

A voltage is applied between the input pad IP1 and the output pad IP1, to measure a resistance of the conductive pattern 100. It is concluded that a portion of the conductive pattern 100 is open in the case in which a measured resistance is higher than a value of the specific line resistance, that is, infinite value of resistance. Further, it is concluded that at least two adjacent line regions of the plurality of line regions 100a of the conductive pattern 100 are shorted in the case that a measured resistance is lower than a value of the specific line resistance.

Hereinafter, in the case that a portion of the conductive pattern 100 is open, a method of locating the position and detecting a size of the defect causing the open is described as follows. As described above, in the case of detecting an open circuit in the conductive pattern 100 by measuring a resistance of the conductive pattern 100, the position where the open circuit exists can be located by operating the plurality of transistors 102. In an embodiment of the present invention, the position where the open circuit exists can be located by a unit of a line region defined by each of the plurality of transistors 102. Further, the open may occur in any one of the plurality of line regions 100a, or at least two adjacent line regions of the plurality of line regions 100a. The process of locating the position where the open occurred is described as follows. First, a voltage is applied between the input pad IP1 and the output pad OP1. Then, any one of the plurality of transistors 102, or a combination thereof, is selected through the transistor selecting part TS, and turned on. Then, whether a current flows through the conductive pattern or not is checked. The above steps are repeated, thereby locating the line region where the open is located.

For example, as shown in FIG. 1, whether a current flows through the conductive pattern 100 or not is checked in the state that a transistor T1, which is first connected to the input pad IP1, is turned on, and the rest of the transistors are turned off. In the same way, whether a current flows through the conductive pattern 100 or not is checked in the state that any one of the rest of the transistors T2, T3, T4, T5 and T6 is turned on, and the rest of the transistors except the selected one are turned off. Then, by combining the result of turning on each of the transistors, the position where open is located can be determined. The results are shown in Table 1 as follows. In Table 1, a 'O' represents that a current flows through the conductive pattern 100, and an 'X' represents that a current does not flow through the conductive pattern 100. Further, for simplification of description, respective line regions, which are defined by the transistors T1, T2, T3, T4, T5, and T6, are represented as A, B, C, D, E, F and G respectively.

TABLE 1

|  | T1 turn on | T2 turn on | T3 turn on | T4 turn on | T5 turn on | T6 turn on |
|---|---|---|---|---|---|---|
| A open | O | X | X | X | X | X |
| B open | O | O | X | X | X | X |
| C open | X | O | O | X | X | X |
| D open | X | X | O | O | X | X |
| E open | X | X | X | O | O | X |
| F open | X | X | X | X | O | O |
| G open | X | X | X | X | X | O |
| A and B open | O | X | X | X | X | X |
| B and C open | X | O | X | X | X | X |
| C and D open | X | X | O | X | X | X |
| D and E open | X | X | X | O | X | X |
| E and F open | X | X | X | X | O | X |
| F and G open | X | X | X | X | X | O |

That is, if a current flow is detected only in the case that one of the two transistors connected to both ends of a line region is turned on, and if a current flow is not measured in the case that any one of the rest of the transistors is turned on, the line region is concluded to be open.

For example, if a current flow is detected in the case that only one transistor T2 or T3 is turned on, and if a current flow is not detected in the case that one of the rest of transistors T1, T4, T5, and T6 is turned on, it is concluded that a line region C of the plurality of line regions 100a is open. Further, if a current flow is detected in the case that only one of the transistors T1, T2, T3, T4, T5 or T6 is turned on, and if a current flow is not detected in the case that one of the rest of the transistors except the selected transistor is turned on, it is concluded that the two line regions, which are connected to the selected transistor, are open at the same time. For example, if a current flow is detected in the case that only one transistor T3 is turned on, and if a current flow is not detected in the case that one of the rest of transistors T1, T2, T4, T5, and T6 is turned on, it is concluded that the line regions C and D, which are connected to the transistor T3, are open at the same time.

As shown in Table 1, a same result is achieved in the case that a line region 'A' and a line region 'B' are open at the same time, and in the case that only a line region 'A' is open. That is, if a current flow through the conductive pattern 100 is detected only when a transistor 'T1' operates, and a current flow is not detected when one of the rest of transistors T2, T3, T4, T5, and T6 is turned on, it cannot be determined whether only the line region 'A' is open, or line regions 'A' and 'B' are open at the same time. In this case, when a voltage is applied between the additive input pad IP2 and the output pad OP1, if a current flow through the conductive pattern 100 is detected, only the line region 'A' is open, and in the opposite case, it is concluded that the line regions 'A' and 'B' are open at the same time. In the same way, by applying a voltage between the input pad IP1 and the additive output pad OP2, it is determined whether a current flow through the conductive pattern 100 is detected, or not, to discriminate the cases in that only the line region 'G' is open, and the line regions 'F' and 'G' are open at the same time.

Also, in the case that more than three adjacent line regions are open at the same time, the position where the open exists can be located by detecting where a current flow is measured through the conductive pattern 100 or not, after turning on the two transistors connected to both ends of the connecting region 100b and turning off the rest of transistors, and repeating the above steps.

FIG. 3 is a schematic plan view of a conductive pattern region of FIG. 2 illustrating a method of determining a size of the defect causing an open according to an embodiment of the present invention.

Referring to FIG. 3, if the number of the open line regions among the plurality of line regions 100a by the above method is determined, a size of the defect causing the open can be determined. As described above, it is assumed that the defect causing the open is only one inside the conductive pattern 100. In the case that only one line region among the plurality of line regions 100a of the conductive pattern 100 is open, as shown in FIG. 3, it is concluded that a size of the defect D1 causing the open is approximately greater than or equal to a width W of the line region, and is smaller than or equal to the sum of a width W of the line region and widths 2S of the two space regions on both sides of the line region. Further, as shown in FIG. 3, in the case that two adjacent line regions among the plurality of line regions 100a of the conductive pattern 100 are open at the same time, a size of the defect D2 causing the open is greater than or equal to the sum of the widths 2W of the open line regions and the width S of the space region 104 disposed between the open line regions, and smaller than or equal to the sum of the widths 2W of the open line regions and the widths 3S of the space region disposed between the open line regions and the space regions respectively disposed beside the open line regions. Therefore, a size of the defect causing open in the conductive pattern 100 can be given by a formula as follows.

$$nW+(n-1)S \leq Do \leq nW+(n+1)S \qquad \text{<Formula 2>}$$

(Do: size of a defect causing the open circuit, W: width of a line region, S: width of a space region, n: number of line regions having open circuits)

Hereinafter, a method of determining a size of the defect causing short when short exists in a region of the conductive pattern 100 will be described.

FIG. 4 is a schematic plan view illustrating a conductive pattern region of FIG. 2 to describe an evaluation method of a size of the defect causing a short circuit according to an embodiment of the present invention.

Referring to FIG. 4, by checking the number of the line regions among the plurality of line regions 100a having a short circuit, a size of the defect causing a short circuit can be determined. It is assumed that the defect causing the short is only one inside the conductive pattern 100. As described above, in the case that a resistance of the conductive pattern 100 has a value lower than the specific line resistance, it is concluded that at least two adjacent line regions among the plurality of line regions 100a of the conductive pattern 100 contain short circuits. As the number of the shorted line regions among the plurality of line regions 100a is increased, the value of the measured resistance is lowered. Because of this, a difference of the values of changed resistances is used to detect the number of the shorted line regions. In the case that n line regions are shorted, a size of the defect causing the short can be given by a formula as follows.

$$(n-2)W+(n-1)S \leq Ds \leq nW+(n+1)S \qquad \text{<Formula 3>}$$

(Ds: size of a defect causing a short circuit, W: width of a line region, S: width of a space region, n: number of line regions having short circuits)

That is, in the case that two adjacent line regions among the plurality of line regions 100a of the conductive pattern 100 are shorted at the same time, a size of the defect D3 causing the short is greater than or equal to the width S of the space region 104 disposed between the shorted line regions, and smaller than or equal to the sum of the widths 2W of the shorted line regions and the widths 3S of the space region disposed between the shorted line regions and the space regions respectively disposed beside the shorted line regions.

As described above, the present invention provides a method of detecting whether an electrical failure of a conductive pattern exists, detecting types of the electrical failure, locating the position where the electrical failure is generated, and determining a size of the defect causing the electrical failure, using a test pattern of a semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A test pattern of a semiconductor device comprising:
    a conductive pattern disposed on a semiconductor substrate;
    a plurality of electrically connected transistors that define the conductive pattern by a predetermined interval, in which source and drain regions are electrically connected to different positions of the conductive pattern respectively to form conductive line regions of the conductive pattern; and
    a transistor selecting part electrically connected to each gate of the plurality of electrically connected transistors that define the conductive pattern, for selecting at least one of the plurality of electrically connected transistors, wherein the transistor selecting part selects a first combination of the at least one of the plurality of electrically connected transistors to determine an electrical failure position, and selects a second combination of the at least one of the plurality of electrically connected transistors to determine a defect size between at least two adjacent conductive line regions.

2. The test pattern of a semiconductor device according to claim 1, wherein the conductive pattern is a polysilicon pattern.

3. The test pattern of a semiconductor device according to claim 1, further comprising an input pad connected to one end of the conductive pattern, and an output pad connected to the other end of the conductive pattern.

4. The test pattern of a semiconductor device according to claim 1, wherein the transistor selecting part includes a plurality of selecting pads electrically connected to gates of the plurality of electrically connected transistors.

5. The test pattern of a semiconductor device according to claim 1, wherein the transistor selecting part includes a decoder electrically connected to gates of the plurality of electrically connected transistors, and a decoder pad for transmitting an input signal to the decoder.

* * * * *